(12) United States Patent
Park et al.

(10) Patent No.: US 6,971,863 B2
(45) Date of Patent: Dec. 6, 2005

(54) MOLDING APPARATUS FOR MOLDING SEMICONDUCTOR DEVICES IN WHICH THE MOLD IS AUTOMATICALLY TREATED WITH A RELEASING AGENT

(75) Inventors: Kyung-soo Park, Cheonan (KR); Tae-hyuk Kim, Cheonan (KR); Hoon Chang, Cheonan (KR); Sung-soo Lee, Cheonan (KR)

(73) Assignee: Samsung Electronics Co., LTD, Kyungki-do (KR)

( * ) Notice: Subject to any disclaimer, the term of this patent is extended or adjusted under 35 U.S.C. 154(b) by 201 days.

(21) Appl. No.: 10/320,485

(22) Filed: Dec. 17, 2002

(65) Prior Publication Data

US 2003/0224079 A1 Dec. 4, 2003

(30) Foreign Application Priority Data

May 28, 2002 (KR) .............................. 2002-29608

(51) Int. Cl.[7] .................. B29C 45/14; B29C 70/72
(52) U.S. Cl. ................. 425/116; 425/126.1; 425/225; 264/39; 264/272.17
(58) Field of Search ............................ 425/116, 126.1, 425/225; 264/39, 272.17

(56) References Cited

U.S. PATENT DOCUMENTS 5,097,652 A * 3/1992 Inamura et al. ............... 53/493
5,770,128 A * 6/1998 Kobayashi et al. ........... 264/39
6,007,316 A * 12/1999 Bandoh ........................ 425/116

FOREIGN PATENT DOCUMENTS

| JP | 59-119736 | | 7/1984 | |
| JP | 63196050 A | * | 8/1988 | ........... H01L 21/60 |
| JP | 03277514 A | * | 12/1991 | ........... B29C 45/02 |
| JP | 03277515 A | * | 12/1991 | ........... B29C 45/02 |
| JP | 03277516 A | * | 12/1991 | ........... B29C 45/02 |
| JP | 04352433 A | * | 12/1992 | ........... H01L 21/56 |
| JP | 07321134 A | * | 12/1995 | ........... H01L 21/56 |
| JP | 2001300978 A | * | 10/2001 | ........... B29C 45/14 |

OTHER PUBLICATIONS

Partial machine translation of JP 07-321,134A obtained from the JPO website.*
Korean Office Action with English-language translation.

* cited by examiner

Primary Examiner—Robert B. Davis
(74) Attorney, Agent, or Firm—Harness, Dickey & Pierce, P.L.C.

(57) ABSTRACT

A molding apparatus for molding semiconductor devices using a molding compound in which a mold is automatically treated with a mold releasing agent is provided. A lead frame strip in-magazine part and a tablet loading part are designed so that dummy lead frame strips and releasing tablets used in a mold releasing agent treatment process are automatically supplied to the molding apparatus in a mold releasing agent treatment mode or a mold cleaning mode. After the mold releasing agent treatment mode or mold cleaning mode is complete, the molding apparatus is switched back to a normal molding process and normal lead frame strips and molding compound tablets are to the mold part. In addition, a pick-up part and a stack magazine part are designed to distinguish by-products generated during the mold releasing agent treatment process from normally molded products by switching from a normal molding process to either a mold releasing agent treatment process or a mold cleaning process.

35 Claims, 7 Drawing Sheets

MOLDING APPARATUS FOR MOLDING SEMICONDUCTOR DEVICES IN WHICH THE MOLD IS AUTOMATICALLY TREATED WITH A RELEASING AGENT

This non-provisional application claims priority under 35 U.S.C. §119 to Korean Patent Application No. 2002-29608 filed May 28, 2002, the contents of which are incorporated herein by reference in its entirety.

BACKGROUND OF THE INVENTION

1. Field of the Invention

The present invention relates generally to the field of manufacturing semiconductor devices, and more particularly, to a molding apparatus for molding semiconductor devices using a molding compound in which a mold is automatically treated with a releasing agent during a molding process by selecting an operation mode.

2. Description of the Related Art

In the molding step in a process for assembling semiconductor devices, chip-type semiconductor devices are encapsulated with a molding compound. The molding compound is a material containing a thermosetting resin, such as an epoxy molding compound (EMC). The molding apparatus, which molds the semiconductor devices, is automated so that semiconductor devices can be mass produced through a continuous and automatic repetition of the molding process.

FIG. 1 is a block diagram of a prior art auto molding apparatus for molding semiconductor devices. Referring to FIG. 1, the auto molding apparatus includes a mold part 40 where the process of molding semiconductor devices is substantially performed, an in-magazine part 10, a molding compound tablet loading part 20, an inloader part 30, an unloader part 50, a degating part 60, a pick-up part 70, and a stack magazine part 80.

The in-magazine part 10 stores the lead frame strips to which the semiconductor devices are wire-bonded until they are transferred to the inloader part 30. The molding compound tablet loading part 20 stores the molding compounds in a tablet form until they are transferred to the inloader part 30. Once the molding compound tablets and the lead frame strips are arranged in the inloader part 30, the molding compound tablets and lead frame strips are transferred to and molded in the mold part 40. The unloader part 50 transfers the molded lead frame strips to the degating part 60, which degates the transferred lead frame strips. The pick-up part 70 then picks up the lead frame strips including degated molding products and sequentially stacks the lead frame strips in the stack magazine part 80. The auto molding apparatus thus described molds a mass of semiconductor devices by automatically and continuously repeating this molding process.

As the molding process (including the hardening of the molding compound, e.g., the EMC) is repeated, the releasing property of the mold used to mold the semiconductor devices deteriorates. Such a deterioration in the mold releasing property can result in poor molding characteristics, including such items as sticking, chip cracking, package cracking, delamination, and the like.

To compensate for the deterioration of the mold releasing property due to the repetition of the molding process, the mold is periodically cleaned and treated or coated with a releasing agent. The period of cleaning and release-treating the mold is dependant on the types of molding compounds used and the shapes of the molded packages. However, the mold is typically cleaned and treated approximately two to four times a day.

The auto molding apparatus of the prior art does not provide for automatic cleaning and treating. The mold is manually cleaned and treated with the releasing agent. As shown in FIG. 1 and described above, the auto molding apparatus is designed to automatically repeat the molding process. Thus, in order to clean and release-treat the mold, the auto molding apparatus must be forced to stop its normal automatic molding process. Once the molding process has stopped, the auto molding apparatus is switched to a manual mode, e.g., a cleaning mode.

To clean and release-treat the mold, the lead frame strips are manually taken out of the in-magazine part 10. Next, dummy lead frame strips that will be used during the mold cleaning and the mold releasing agent treatment process are mounted in the in-magazine part 10. The molding compounds, e.g., the EMC tablets, are removed from the molding compound tablet loading part 20 and the molding compound tablet loading part 20 is filled with a cleaning agent, e.g., cleaning tablets that include a melamine resin as the main component.

The auto molding apparatus is then switched back to the automatic mode and the automatic molding process again begins its repetitive cycle. Since the dummy lead frame strips are loaded in the in-magazine part 10 and the cleaning tablets are loaded in the molding compound tablet loading part 20, the dummy lead frame strips are transferred to the mold part 40, the cleaning agent is injected into the mold, and the dummy lead frame strip are molded. The mold is cleaned in the molding process for cleaning. The cleaning by-products molded in this "cleaning" automatic molding process are transferred to the stack magazine part 80 and then to the outside of the auto molding apparatus. The cleaning by-products are manually removed from the stack magazine 80.

After the cleaning molding process is repeated several times, the auto molding apparatus is switched off. The cleaning tablets are then removed from the molding compound tablet loading part 20 and the molding compound tablet part 20 is filled with releasing tablets (e.g., wax tablets) to improve the releasing property of the mold. Next, the auto molding apparatus is switched on so that it begins operating in the auto mode. The dummy lead frame strips are transferred to the mold part 40, the releasing agent, e.g., a wax, is injected into the mold, and the dummy lead frame strips are molded. In this "releasing treatment" molding process, the mold is coated with the releasing agent or waxed by a molding process for the mold releasing agent treatment, e.g., a wax molding process. By-products generated in the releasing treatment molding process or wax molding process are manually removed from the stack magazine part 80.

The releasing tablets are then taken out of the molding compound tablet loading part 20, molding compound tablets are loaded into the molding compound tablet loading part 20, and one shot molding work is performed. In other words, after the molding compound, i.e., the EMC, is injected into the dummy lead frame strips, to mold the dummy lead frame strips, the worker checks the appearances of molding products that are discharged from the stack magazine part 80. If the appearances of the molding products are normal, the cleaning mode is released from the auto molding apparatus and the auto molding apparatus stands by for a normal work. In other words, normal lead frame strips are loaded in the in-magazine part 10, and then the normal work is performed.

Although cleaning tablets are typically used to clean the mold, cleaning rubber sheets may also be used. As with the manual cleaning process using cleaning tablets, the molding apparatus must be switched off the automatic molding cycle and switched to a cleaning mode when cleaning rubber sheets are used. Next, an operator manually prepares the cleaning rubber sheets, carries out the molding process with dummy lead frame strips, and then carries out a mold releasing agent treatment process, e.g., a wax molding process. After the mold cleaning process and the wax molding process have been completed, the dummy lead frame strips are molded with an EMC and the appearance of the molded products are manually checked.

The time required to clean and treat the mold with the releasing agent one time is at least 30 minutes or more. Thus, the time required to perform the mold cleaning process and the mold releasing agent treatment process four times a day requires at least 120 minutes. As a result, the interruption of the operation of the molding apparatus can significantly decrease the productivity of the auto molding apparatus.

Furthermore, as semiconductor devices become thinner such as TSOP, BGA, QFP, and the like, it is desirable to maintain the releasing property of the mold in the molding process. As a result, the mold has to be more frequently treated with a releasing agent. Moreover, as the thicknesses of semiconductor devices decreases, the amount of time in which the releasing property decreases becomes shorter. Thus, the period of time for cleaning the mold or treating the mold with a releasing agent in the molding process also needs to become shorter.

In addition, the molding apparatus is designed to treat the mold with the releasing agent after the mold is cleaned. Thus, the mold releasing agent treatment process is performed only during the period of the mold cleaning process.

Furthermore, because the mold cleaning process and the mold releasing agent treatment process are manually performed in the molding apparatus, a significant amount of time is required to complete these processes. As a result, the productivity of the molding apparatus sharply deteriorates.

SUMMARY OF THE INVENTION

At least one exemplary embodiment of the present invention provides a molding apparatus for molding semiconductor devices that automatically repeats a process of cleaning a mold or treating a mold with a releasing agent to prevent the releasing property of the mold from deteriorating due to the repetition of the molding process. In such an exemplary embodiment, the productivity of molded products increases.

In at least one exemplary embodiment of the present invention, a molding apparatus for molding semiconductor devices is provided that includes a mold part where the molding process is performed, an in-magazine part which stores lead frame strips, a tablet loading part which stores tablets to be supplied to the mold part, a stack magazine part which holds the stacked molded products, and a pick-up part that transfers the molded products to the stack magazine part.

In an exemplary embodiment of the present invention, the in-magazine part includes a normal lead frame strip magazine part, a dummy lead frame strip magazine part, and a magazine switching part. In the normal lead frame strip magazine part, normal lead frame strips that are to be supplied to the mold part are loaded in lead frame strip magazines. In the dummy lead frame strip magazine part, dummy lead frame strips that are to be supplied to the mold part are loaded in dummy lead frame strip magazines. The magazine switching part switches from the normal lead frame strip magazine part to the dummy lead frame strip magazine part in a mold releasing agent treatment process or a mold cleaning process.

In at least one exemplary embodiment of the present invention, the magazine switching part may include a first container part, a second container part, and an elevator. The first container part contains a normal lead frame strip magazine containing normal lead frame strips. The second container part contains a dummy lead frame strip magazine that contains dummy lead frame strips. The elevator selectively moves the first and second container parts to a position where the normal lead frame strips or the dummy lead frame strips are transferred to the mold part according to an operation mode. The second container part may be installed over the first container part on the same elevating line so that the first and second container parts ascend and descend along the elevating line together.

In another exemplary embodiment of the present invention, the tablet loading part of the molding apparatus may include a molding compound tablet feeder, a releasing (or cleaning) tablet feeder, and a tablet container feeder. The molding compound tablet feeder stores molding compound tablets to be supplied to the mold part during a normal molding process mode. The releasing tablet feeder stores releasing tablets to be supplied to the mold part during a mold releasing agent treatment process mode. The tablet container feeder is selectively supplied with tablets from the molding compound tablet feeder or the releasing tablet feeder depending on whether the molding apparatus is in a normal molding process mode or a mold releasing agent treatment process mode.

In at least one exemplary embodiment of the present invention, the molding compound feeder may be installed adjacent to the tablet container feeder and the releasing tablet feeder may be installed over the tablet container feeder.

In at least one exemplary embodiment of the present invention, the releasing tablet feeder may include releasing tablet hoppers, stoppers, and a moving part. The releasing tablet hoppers store releasing tablets. The stoppers are positioned at the outlets of the releasing tablet hoppers to control the dispensing of the releasing tablets. The moving part can be positioned to slide on a guide shaft so that the releasing tablet hoppers can ascend during a normal molding process and descend during a mold releasing agent treatment process so that the releasing tablet hoppers can be in a position to supply releasing tablets to the tablet container feeder. The tablet container feeder may further include a trigger which unlocks the stoppers when they contact the stoppers.

In an exemplary embodiment of the present invention, the releasing tablet hoppers may be exchanged for cleaning tablet hoppers (which store cleaning tablets) in a mold cleaning process mode. The cleaning tablet hoppers have substantially the same shape as the releasing tablet hoppers so that they can be easily and quickly installed.

In at least one exemplary embodiment of the present invention, the molding apparatus may include a by-product unloading part which stores by-products molded in the mold part in the mold releasing agent treatment process mode or the mold cleaning process mode. The pick-up part transfers the molded products to the stack magazine part in a normal molding process and transfers the by-products to the by-product unloading part in a mold releasing agent treatment process or a mold cleaning process. The by-product unloading part may be installed under the pick-up part. The molding apparatus may further include a housing having a monitoring shutter through which the by-products loaded in the by-product unloading part are discharged.

According to an exemplary embodiment of the present invention, a mold releasing agent treatment process or a mold cleaning process can be automatically performed during a process of molding semiconductor devices in the molding apparatus. Thus, the time and the amount of work required of a worker in the mold releasing agent treatment process or the mold cleaning process can be minimized. Further, this minimization of time increases the working ratio of the molding apparatus and greatly increases the productivity of the semiconductor devices.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

Figure 1:
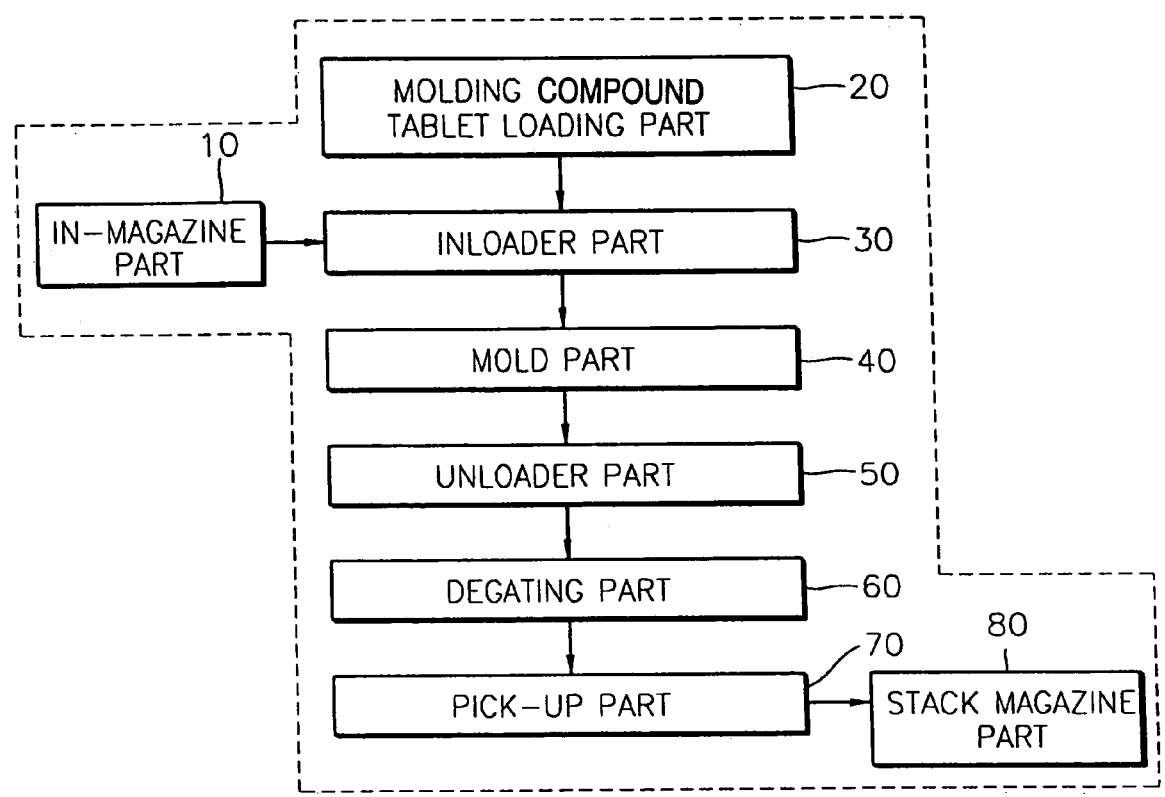
FIG. 1 is a schematic block diagram of a conventional molding apparatus for molding semiconductor devices.

Hereinafter, exemplary embodiments of the present invention will be described in detail with reference to the attached drawings. However, it is to be understood that the exemplary embodiments of the present invention can be modified into various other forms, and the scope of the present invention must not be interpreted as being restricted to the embodiments set forth herein. Rather, these embodiments are provided so that this disclosure will be thorough and complete and will fully convey the concept of the present invention to those skilled in the art. In drawings, the thicknesses of layers or regions are exaggerated for clarity. Like reference numerals in the figures represent the same element. It will also be understood that when a layer is referred to as being "on" another layer or a substrate, it can be located directly on the other layer or the substrate, or intervening layers may be present.

One exemplary embodiment of the present invention teaches a molding apparatus that automatically and periodically treats a mold with a releasing agent during the molding process. To switch from a molding process to a mold releasing agent treatment process, an in-magazine part 100 is designed to replace the lead frame strips with the dummy lead frame strips in the inloader part 300 by changing the operation mode of the molding apparatus. In addition, a tablet loader part 200 is designed to replace molding compound tablets with releasing tablets that are used in the mold releasing agent treatment process by changing the operation mode of the molding apparatus. Further, a pick-up part 700 and a stack magazine part 850 are designed to store by-products generated during the mold releasing agent treatment process that are separate from normally molded packages by changing the operation mode of the molding apparatus.

In the above-described molding apparatus according to one exemplary embodiment of the present invention, the releasing tablet feeder that is installed in the tablet loading part 200 is substituted for a cleaning tablet feeder to automatically clean the mold by changing the operation mode of the molding apparatus.

Unlike the conventional molding apparatus described above, in the molding apparatus according to an exemplary embodiment of the present invention, the mold releasing agent treatment process or the mold cleaning process can be performed automatically. Therefore, the time required for a worker to manually switch from the molding process to a cleaning process can be greatly reduced, or even eliminated. As a result, the productivity of molding semiconductor devices in the molding apparatus can be greatly increased.

One exemplary embodiment of the molding apparatus according to the present invention will now be described in more detail with specific reference to FIGS. 2–7.

Figure 2:
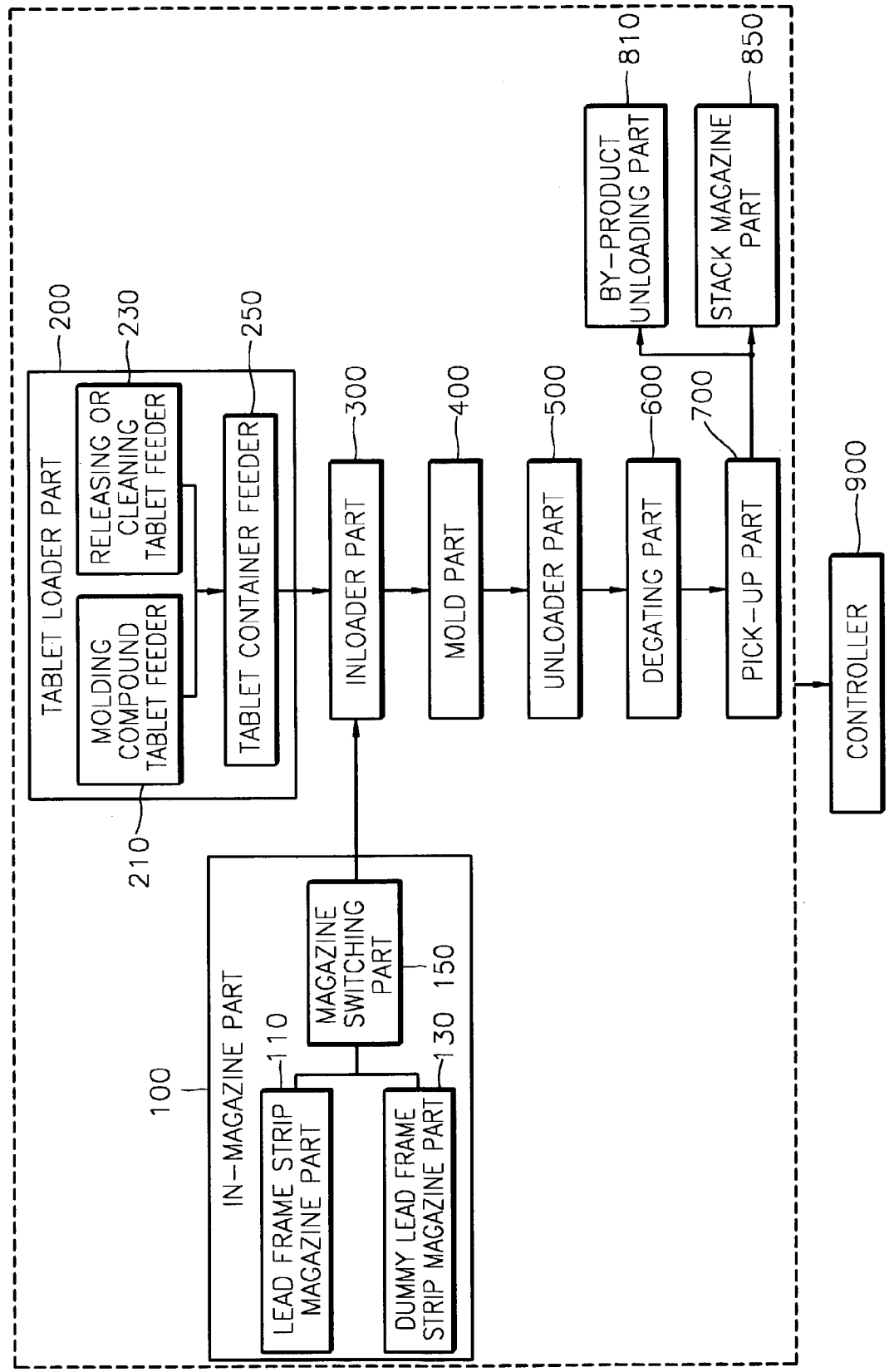
FIG. 2 is a schematic block diagram of a molding apparatus for molding semiconductor devices according to an exemplary embodiment of the present invention.

Referring to FIG. 2, a block diagram of a molding apparatus for molding semiconductor devices according to one exemplary embodiment of the present invention can be seen. As seen in FIG. 2, the molding apparatus includes a mold part 400, an inloader part 300, an unloader part 500, and a degating part 600. In addition, the molding includes an in-magazine part 100, a tablet loading part 200, a pick-up part 700, a by-product unloading part 810, and a stack magazine part 850 which are designed to automatically clean or treat the mold with a releasing agent according to a mode that is controlled by controller 900.

The mold part 400 includes a mold (not shown) and a press (not shown). The molding process for molding semiconductor devices is substantially carried out in the mold part 400. In the mold, a plurality of semiconductor devices are arranged so that numerous semiconductor devices can be molded at one time. The press includes a plurality of plungers which inject an EMC into the mold.

The inloader part 300 transfers lead frame strips from the in-magazine part 100 and molding compound tablets from the tablet loading part 200 to the mold part 400. A plurality of lead frame strips, each mounting a plurality of semiconductor devices thereon, may be molded in one mold. For example, a plurality of lead frame strips are arranged in the inloader part 300. The tablet loader part 200 then supplies EMC tablets to the inloader part 300, where the EMC tablets are arranged among the lead frame strips. Next, the inloader part 300 transfers the arranged EMC tablets and lead frame strips to the mold part 400. A known transfer unit, such as a damper or the like, installed in the inloader part 300 can arrange and transfer the EMC tablets and lead frame strips to the mold part 400.

The unloader part 500 transfers packages that are molded in the mold part 400 to the degating part 600. The degating part 600 degates remaining EMC tablets from the transferred lead frame strips.

The structures of the mold part 400, the inloader part 300, the unloader part 500, and the degating part 600 may be the same as a mold part, an inloader part, a unloader part, and a degating part of a known auto molding apparatus for molding semiconductor devices.

The in-magazine part 100, the tablet loading part 200, the pick-up part 700, the by-product unloading part 810, and the stack magazine part 850 will be described in detail with reference to FIGS. 3 and 4.

Figure 3:
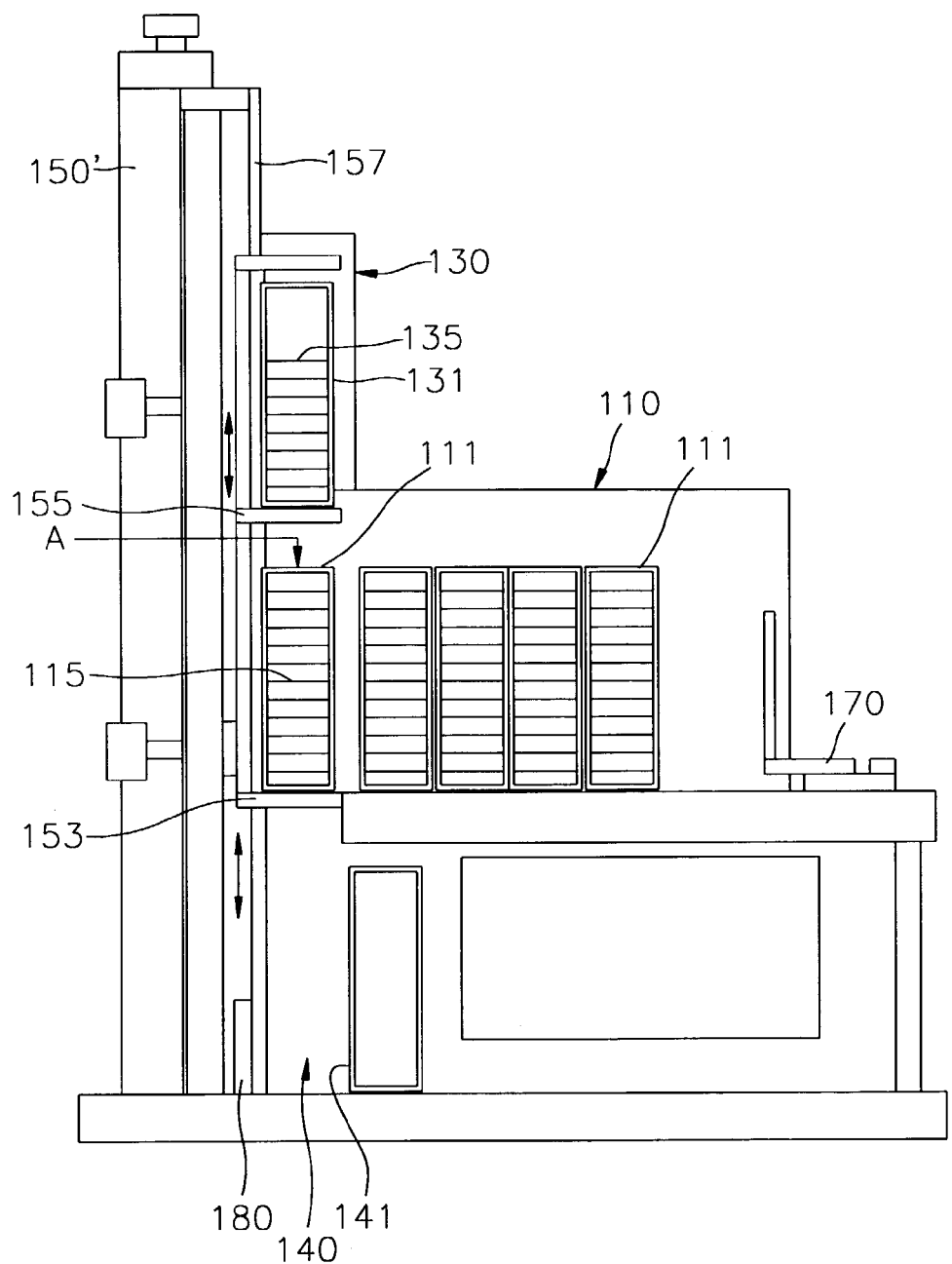
FIG. 3 is a schematic cross-sectional view explaining an in-magazine part used in the molding apparatus according to an exemplary embodiment of the present invention.

In particular, FIG. 3 is a schematic cross-sectional view illustrating an in-magazine part used in the molding apparatus according to one exemplary embodiment of the present invention. FIG. 4 is a schematic cross-sectional view illustrating the operation of changing magazines in the in-magazine part of the molding apparatus according to one exemplary embodiment of the present invention.

Figure 4:
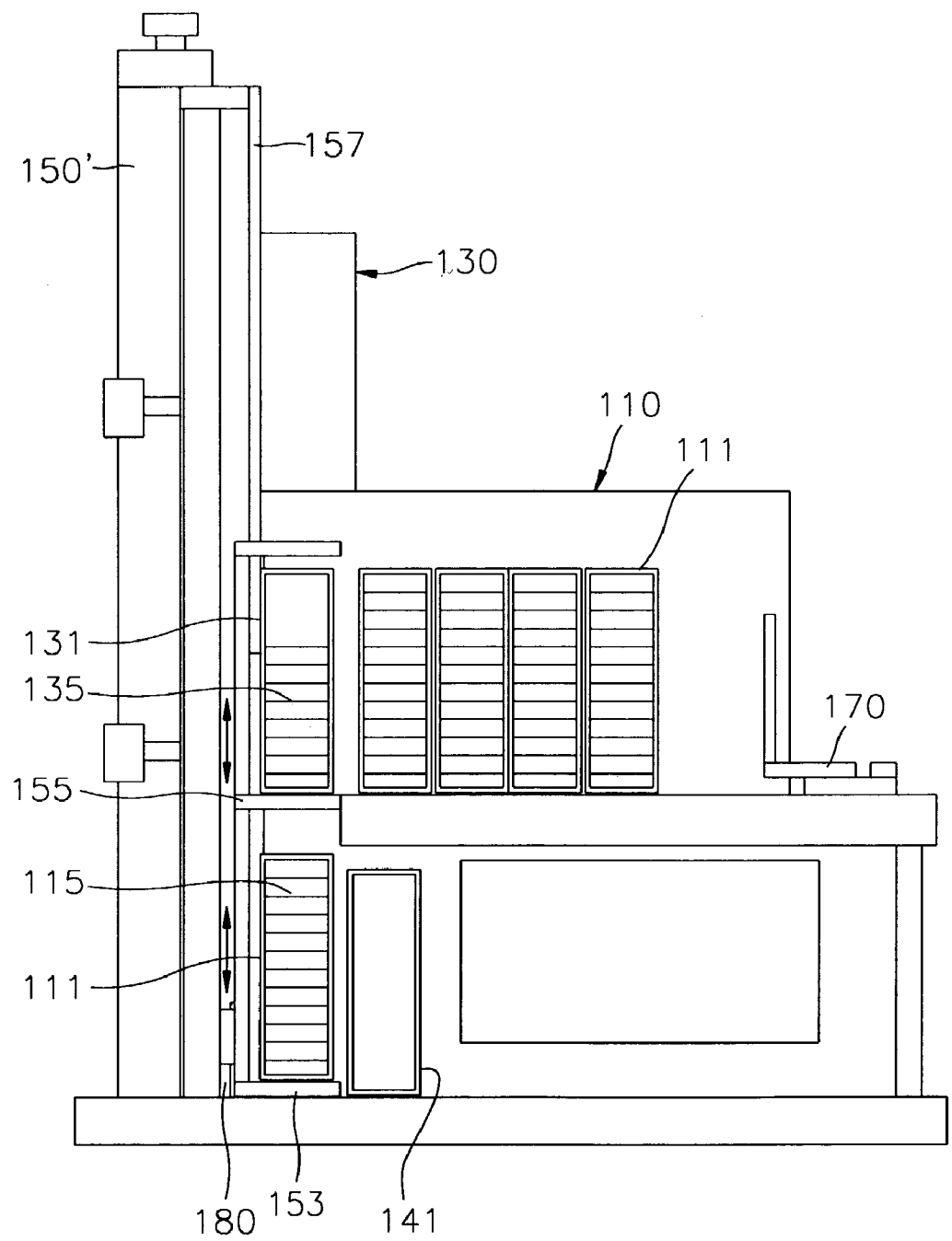
FIG. 4 is a cross-sectional view illustrating the operation of switching magazines of the in-magazine part used in the molding apparatus according to at least one exemplary embodiment of the present invention to empty magazines.

As seen in FIGS. 3 and 4, the in-magazine part (reference numeral 100 of FIG. 2) includes a lead frame strip magazine part 110 in which lead frame strip magazines 111 are stored and a dummy lead frame strip magazine part 130 in which dummy lead frame strip magazines 131 are stored.

Initially, the lead frame strip magazines 111 are arranged and loaded in the lead frame strip magazine part 110. Normal lead frame strips 115, each mounting semiconductor devices to be molded, are sequentially loaded in each of the lead frame strip magazines 111. Dummy lead frame strips 135 are loaded in the dummy lead frame strip magazines 131.

The arranged lead frame strip magazines 111 are then pushed by a magazine pusher 170 to sequentially move to position A where the lead frame strips 115 are transferred to the inloader part (reference numeral 300 of FIG. 2). In particular, a lead frame strip pusher (not shown) placed over the lead frame strip magazine 111 in position A sequentially pushes the lead frame strips 115 loaded in the lead frame strip magazine 111 to transfer the lead frame strips 115 to the inloader part 300.

Once a lead frame strip magazine 111 is empty (e.g., all of the lead frame strips 115 have been transferred to the inloader part 300), an elevator 150' transfers the empty magazine 141 to an empty magazine part 140 positioned under the lead frame strip magazine part 110. For example, in position A, a first container part 153 of the elevator 150' contains the lead frame strip magazine part 110. The empty magazine 141 transferred to the empty magazine part 140 by the elevator 150' is removed from the first container part 153 by an empty magazine pusher 180 and stably placed in the empty magazine part 140. The elevator 150', which now contains an empty first container part 153, then rises to a position adjacent the lead frame strip magazines 111 in the lead frame strip magazine part 110 so that a new lead frame strip magazine 111 can be transferred to the first container part 153 in position A by the magazine pusher 170.

Through this process, the normal lead frame strips 115 that are to be molded are sequentially transferred from the in-magazine part 100 to the inloader part 300.

The dummy lead frame strip magazine part 130 is installed on the lead frame strip magazine part 110. The dummy lead frame strips 135 can be used in a process of treating the mold with a releasing agent, e.g., a wax treatment process, or can be used in a process for cleaning the mold. The dummy lead frame strips 135 are loaded in the dummy lead frame strip magazine 131 and are stored in the dummy lead frame strip magazine part 130.

For example, the dummy lead frame strip magazine 131 is located in a second container part 155 of the elevator 150' which is positioned over the first container part 153 and connected to an elevating line 157 together with the first container part 153. Thus, the first container part 153 descends along with the second container part 155 by the elevator 150'. The second container part 155 is installed so that the dummy lead frame strip magazine 131 contained in the second container part 155 is in position A when the first container part 153 completely descends to the empty magazine part 140.

Since the elevator 150' includes the second container part 155, which stores the dummy lead frame strip magazine 131, the elevator 150' can also serve as the magazine switching part 150 (FIG. 2). In particular, when the controller 900 selects the mode to perform either the mold releasing agent treatment process or the mold cleaning process, the controller 900 moves the elevator 150' downwardly to position the dummy lead frame strip magazine 131 at position A. Thereafter, the dummy lead frame strips 135 are supplied to the inloader part 300. After the mold releasing agent treatment process or the mold cleaning process is completed, the controller 900 changes modes and moves the elevator 150' upwardly so that the lead frame strip magazine 111 is again located at position A.

According to the structure of the in-magazine part 100, the dummy lead frame strip magazine 131 and the normal lead frame strip magazine 111 can be automatically and selectively supplied to the inloader part 300. Thus, the time and cost required for the mold releasing agent treatment process or the mold cleaning process is reduced by excluding manual preparation and supply of dummy lead frame strips as in conventional processes. As a result, the productivity and the working ratio of the molding apparatus is greatly improved.

Figure 5:
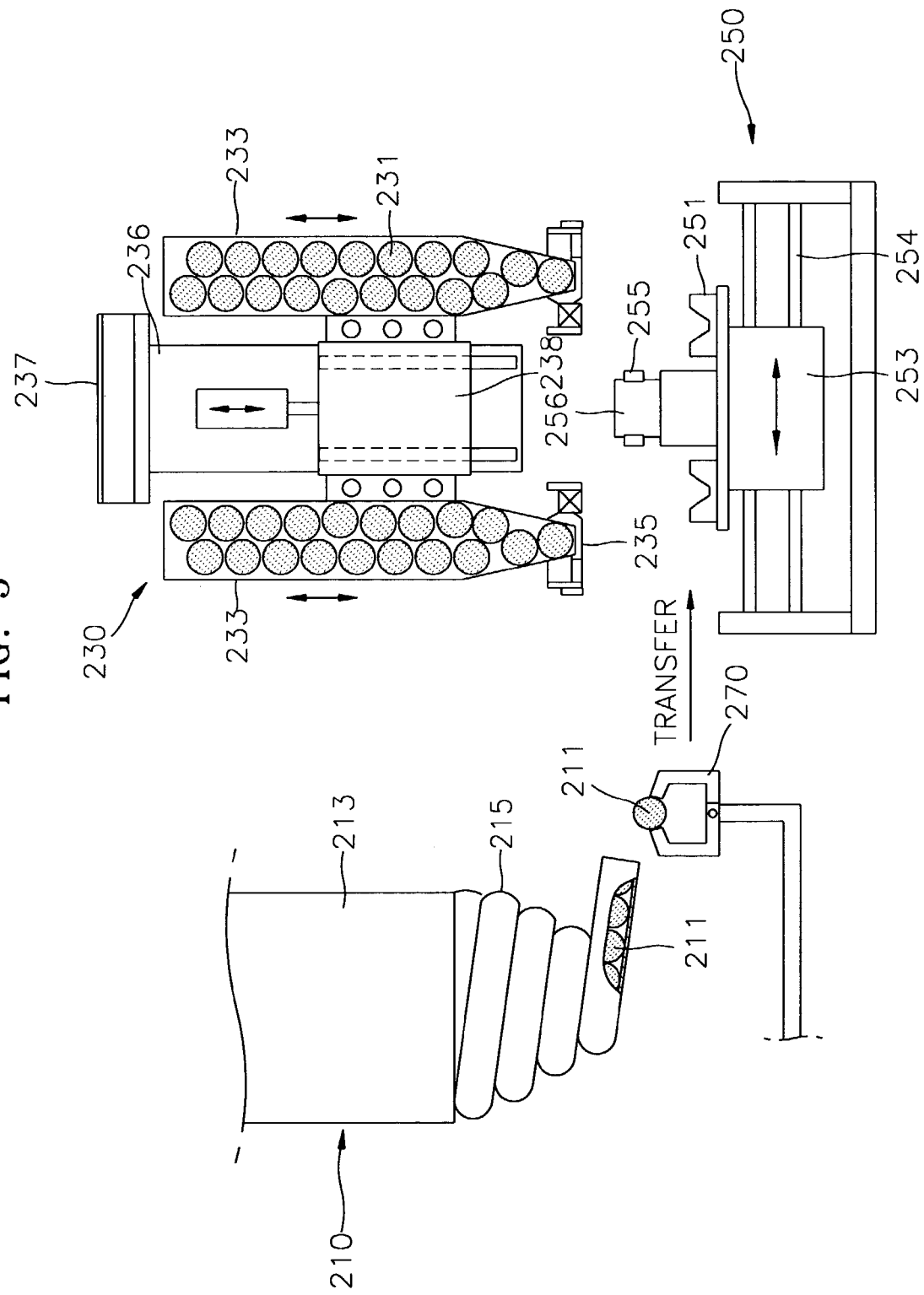
FIG. 5 is a schematic cross-sectional view illustrating a tablet loading part used the molding apparatus according to an exemplary embodiment of the present invention.
Figure 6:
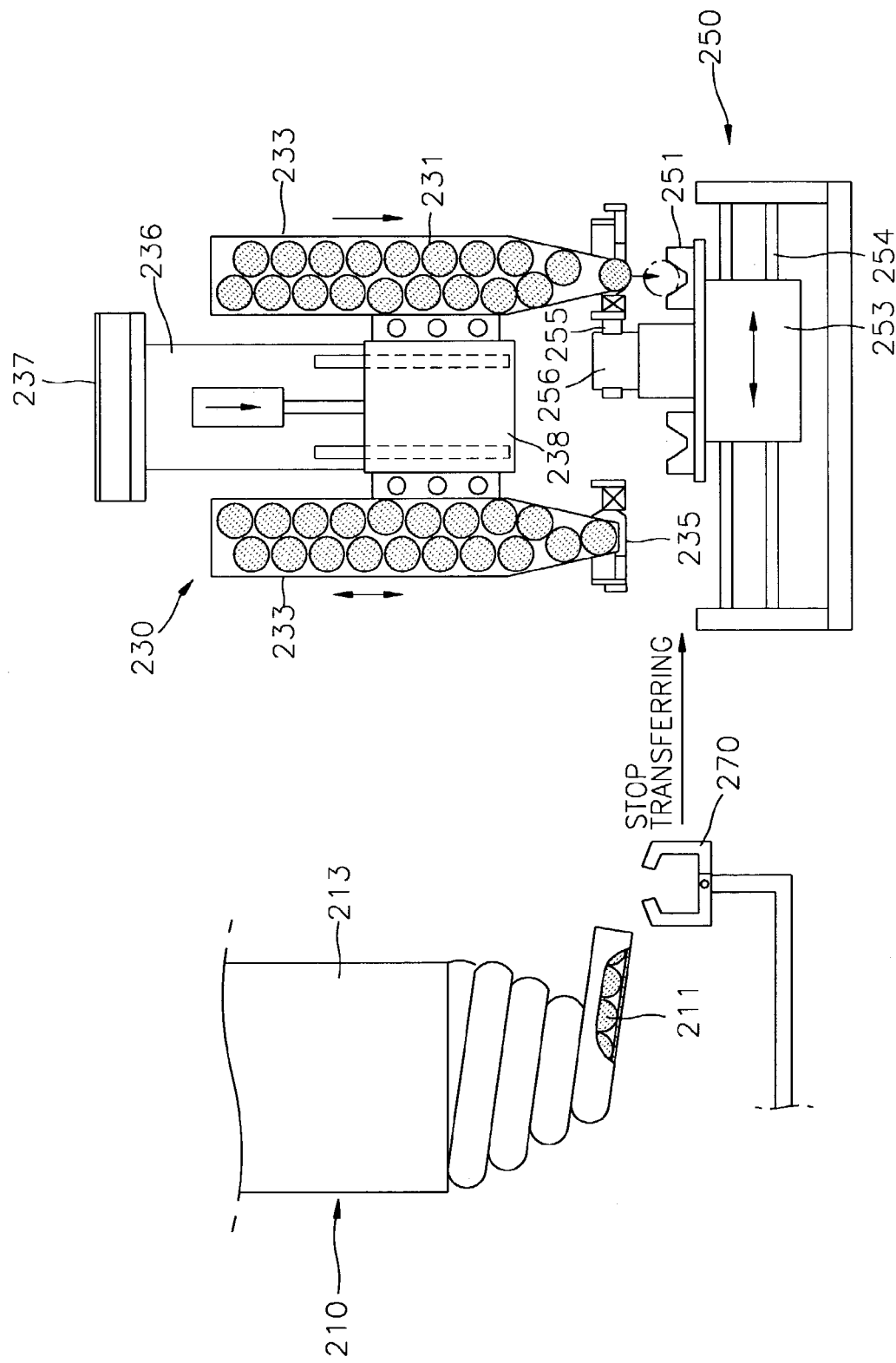
FIG. 6 is a schematic cross-sectional view illustrating the operation of a releasing tablet feeder used in the molding apparatus according to an exemplary embodiment of the present invention.

Turning now to FIGS. 5 and 6, it can be seen that FIG. 5 is a schematic cross-sectional view illustrating a tablet loading part used in the molding apparatus according to one exemplary embodiment of the present invention. FIG. 6 is a schematic cross-sectional view illustrating the operation of a releasing tablet feeder used in the molding apparatus according to one exemplary embodiment of the present invention.

As seen in FIGS. 2, 5, and 6, the tablet loading part (reference numeral 200 of FIG. 2) includes a molding compound tablet feeder 210 and a releasing tablet feeder (or a cleaning table feeder) 230. The molding compound tablet feeder 210 stores and supplies molding compound tablets that mold semiconductor devices mounted on the normal lead frame strips 115. The releasing tablet feeder 230 stores and supplies releasing tablets (or cleaning tablets) used in the mold releasing agent treatment process or the mold cleaning process.

For example, the tablet loader part 200 includes a tablet container feeder 250, such as a bowl feeder, which is selectively supplied with molding compound tablets 211), releasing tablets 233, or cleaning tablets (not shown, but having the same shape as the releasing tablets 233) from the releasing tablet feeder (or the cleaning tablet feeder) 230 and the molding compound tablet feeder 210 according to the mode selected by the controller 900. The tablets contained in the tablet loader part 200 are transferred to the inloader part 300, arranged, and transferred to mold part 400, such as by a transfer damper (not shown).

When the molding apparatus performs a normal molding process, tablets are supplied from the molding compound tablet feeder 210 of the tablet loader part 200 to the tablet container feeder 250. The molding compound tablet feeder 210 includes a hopper 213 which stores a supply of molding compound tablets 211 and a cochlea 215 which sequentially removes the molding compound tablets 211 from the hopper 213 so that a transfer damper 270 can pick up the molding compound tablets 211. The transfer clamper 270 sequentially transfers the molding compound tablets 211 from the cochlea 215 to the tablet container feeder 250.

The tablet container feeder 250 includes tablet container parts 251 positioned on a container body 253 slidably mounted on guide bars 254 to enable the container body 253 to move right and left. The transfer damper 270 picks up molding compound tablets 211 and places them in the tablet container parts 251. The tablet container parts 251 may be installed in right and left positions of the container body 253 and each of the tablet container parts 251 can contain molding compound tablets 211 due to the right and left movement of the container body 253. The molding compound tablets 211 on the tablet container parts 251 are then transferred to the inloader part 300.

A releasing tablet feeder 230 is installed over the tablet container feeder 250. The releasing tablet feeder 230 includes a guide shaft 236 attached to a fixed body 237, a moving part 238 capable of moving up and down along the guide shaft 236, and releasing tablet hoppers 233 affixed to the moving part 238 so that the releasing tablet hopers 233 move along the guide shaft 236 with the moving part 238. As illustrated in FIG. 5, during a normal molding process, the releasing tablet feeder 230 rises with the moving part 238 on the guide shaft 236 to be spaced apart from the tablet container feeder 250. In the normal molding process, the releasing tablets 231 are not supplied to the tablet container feeder 250.

The releasing tablet hoppers 233 are installed on both sides of the moving part 238 so that releasing tablets 231 can be rapidly supplied to the tablet container feeder 250. The releasing tablet hoppers 233 have upper diameters that are suitable for storing the releasing tablets 231 in a zigzag form and lower diameters narrower than the upper diameters to sequentially remove the releasing tablets 231 from the releasing tablet hoppers 233. Stoppers 235 are installed at the outlets located at the bottom of the releasing tablet hoppers 233 so that the releasing tablets 231 are not supplied when the molding apparatus is performing the normal molding process.

When the controller 900 switches from a normal molding operation mode to a selected releasing operation mode to perform a mold releasing agent treatment process, the molding compound tablet feeder 210 stops supplying the molding compound tablets 211 to the tablet container part 251 of the container feeder 250 the releasing tablet feeder 230 supplies the releasing tablets 231 to the tablet container part 251. In some exemplary embodiments of the present invention, the releasing tablets 231 may mainly contain wax components.

Referring now to FIG. 6, when the controller 900 switches from the normal molding operation mode to a selected releasing operation mode to perform the mode releasing agent treatment process, the moving part 238 descends along the guide shaft 236 so that the releasing tablet hoppers 233 are positioned near the tablet container feeder 250. The container body 253 of the tablet container feeder 250 moves right and left along guide bars 254 to sequentially arrange the tablet container parts 251 under the releasing tablet hoppers 233.

A trigger 255, which unlocks the stoppers 235 of the releasing tablet hoppers 233, is installed on a trigger body 256 between tablet container parts 251 on the container body 253. The trigger 255 pushes and unlocks the stoppers 235 when the trigger 255 comes in contact with the stoppers 235. In some exemplary embodiments of the present invention, the stoppers 235 may be operated by air cylinders which can be driven by the trigger 255. Thus, releasing tablets 231 which are not discharged by the stoppers 235, exit the outlets of the hoppers 233 and are placed on the tablet container parts 251.

For example, after one of the releasing tablets 231 is stably placed in one of the container parts 251, e.g., the trigger 255 pushes one of the stoppers 235 so that one of the releasing tablets 231 falls from one of the hoppers 233 into a container part 251, the container body 253 moves in a direction to place the other container part 251 under the other hopper 233. As the container body 253 moves away from the stopper 235, the trigger 255 disengages from the stopper 235 and the stopper 235 locks the outlet of the hopper 233, such as by using a spring or an air cylinder, to block the supply of the releasing tablets 231 and prevent the release of a subsequent releasing tablet 231.

As the container body 253 moves towards the other hopper 233, the trigger 255 installed on the opposite side of trigger body 256 pushes the stopper 235 of the hopper 233 on the opposite side of the moving part 238 and a releasing tablet 231 falls from the hopper 233 into the tablet containing part 251. The releasing tablets 231 on the tablet container parts 251 are then transferred to the inloader part 300, placed into the mold part 400, and molded as After a releasing tablet is transferred to the inloader part 200, the container body 253 moves in direction to place the empty tablet container part 251 under the outlet of one of the hoppers 233 and one of the stoppers 235 is unlocked by a trigger 255 to place one of the releasing tablets 231 on the empty tablet container part 251. Through this process, the mold is treated with the releasing agent.

On the other hand, in the mold cleaning process, the releasing tablet feeder 230 can be replaced with a cleaning tablet feeder (not shown) containing cleaning tablets by replacing the releasing tablet hoppers 233 with cleaning tablet hoppers (not shown). Because the cleaning tablet hoppers (not shown) have shapes similar to the releasing tablet hoppers 233 and the cleaning tablet hoppers are smaller in size than the molding compound tablet hopper 213, the releasing tablet hoppers 233 can be rapidly and easily replaced with cleaning tablet hoppers. The process of supplying cleaning tablets (not shown) during a mold cleaning process can be identical to the process of supplying the releasing tablets described above.

Since the tablet loader part 200 includes the releasing tablet feeder 230 (or the cleaning tablet feeder) which selectively operates by switching the operation mode by the controller 900, a mold releasing agent treatment process or mold cleaning process conducted in the mold apparatus can be automated. Because the manual work previously required by conventional cleaning and mold treatment process is essentially eliminated, the time required to conduct the mold releasing agent treatment process (or the mold cleaning process) is greatly reduce. This reduction in the time needed to conduct the mold releasing treatment process or the cleaning process results in an increase in the working ratio of the molding apparatus. As a result, semiconductor devices can be prevented from being poorly packaged. In addition, the releasing property of the mold can be efficiently prevented from deteriorating due to a reduction in the thicknesses of the packaged semiconductor devices. Thus, a sticking phenomenon that occurs due to the deterioration of the releasing property of the mold, or a chip cracking phenomenon, a package cracking phenomenon, a delamination phenomenon, or the like related to the sticking phenomenon can be effectively prevented.

Similar to the molded products obtained by the molding process according to exemplary embodiments of the present invention, by-products manufactured during the mold releasing agent treatment process or the mold cleaning process are transferred through the unloader part 500 and the degating part 600 to the pick-up part 700, discharged, and loaded. Automatically distinguishing the by-products from the normally molded products is important to reduce the time required for performing the mold releasing agent treatment process or the mold cleaning process.

Figure 7:
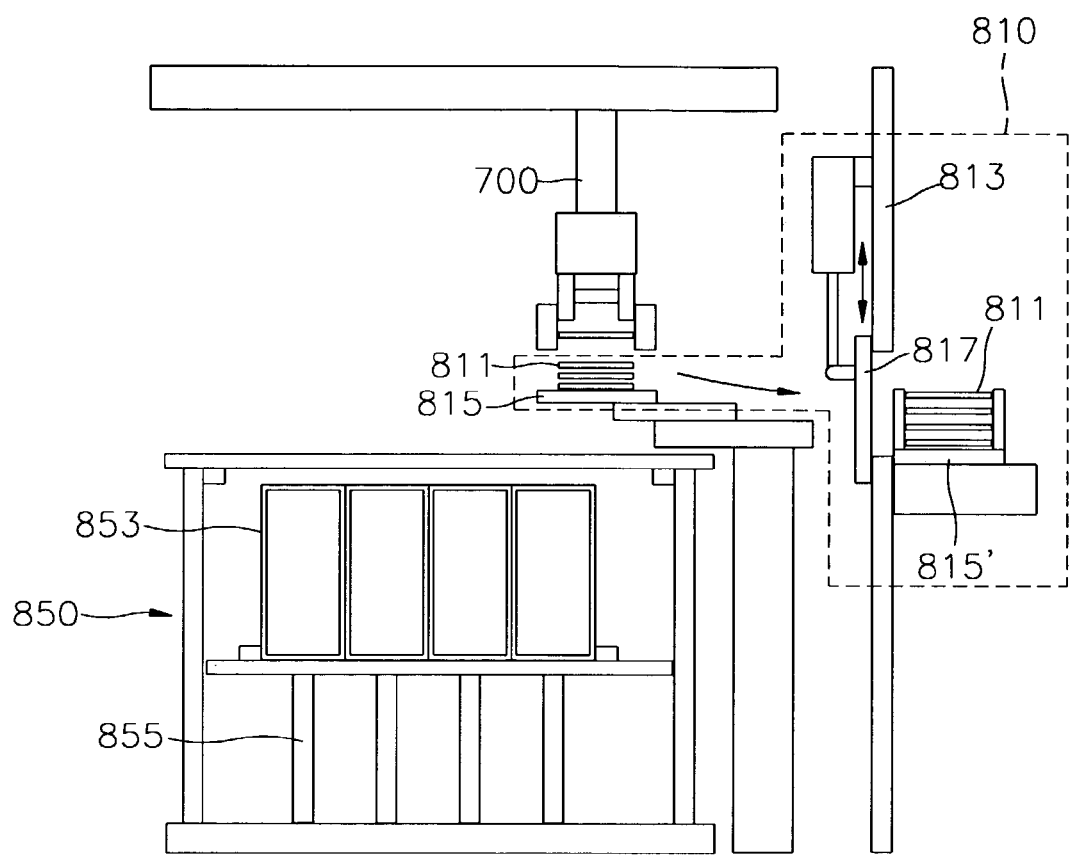
FIG. 7 is a cross-sectional view illustrating a pick-up part, a by-product unloading part, and a stack magazine part used in the molding apparatus according to an exemplary embodiment of the present invention.

Referring now to FIG. 7, a schematic cross-sectional view illustrating a pick-up part 700, a by-product unloading part 810, and a stack magazine part 850 used in a molding apparatus according to an exemplary embodiment of the present invention can be seen. As shown in FIGS. 2 and 7, the by-products, which are generated during the molding process in the mold part 400 in the mold releasing agent treatment process or the mold cleaning process, are unloaded by the unloader part 500 and transferred to the degating part 600. The by-products are degated as dummy lead frame strip-type by-products 811 that are molded in the degating part 600.

When the controller (reference numeral 900 of FIG. 2) changes from a normal molding mode to the mold releasing agent treatment mode or the cleaning mode, the pick-up part 700 transfers the by-products 811 to the by-product unloading part 810 that is located adjacent to the stack magazine part 850, which stores the normally molded lead frame strips. In a conventional molding apparatus, the movement of the pick-up part 700 may be restricted to the stack magazine part 850, and thus the by-product container part 815 of the by-product unloading part 810 is installed under the pick-up part 700.

The by-products 811 loaded on container part 815 of the by-product unloading part 810 are discharged through a monitoring shutter 817 installed on a housing 813 of the molding apparatus and placed on an external container part 815'. A worker can observe the molded state of the by-products 811, which are loaded by the pick-up part 700, during the mold releasing agent treatment process or the mold cleaning process by opening the monitoring shutter 817 or by viewing the by-products 811 through the monitoring shutter 817 if it is formed of a transparent material.

When a normal molding process is performed, the container part 815 of the by-product unloading part 810 is positioned above the stack magazine part 850 so that a magazine lift 855 lifts and loads empty stack magazine parts 853 in addition, the container part 815 of the by-product unloading part 810 may be operated during the normal molding process to discharge normally molded products from the pick-up part 700 through the monitoring shutter 817. As a result, a worker can easily observe the appearance of the molded products during the normal molding process. Further, because of the monitoring shutter 817, the molded products can be prevented from being scraped during the molding process.

Moreover, since the by-product unloading part 810 and the stack magazine part 850 are included in the mold apparatus and the by-product unloading part 810 is installed within a range of the movement of the pick-up part 700, the by-products 811 generated during the mold releasing agent treatment process or the mold cleaning process can be automatically distinguished from the normally molded products.

In the molding apparatus according to an exemplary embodiment of the present invention, which has been described with reference to FIGS. 2 and 7, the mold releasing agent treatment process can be automatically performed. For example, the controller (reference numeral 900 of FIG. 2) sounds an alarm at the period of the mold releasing agent treatment and switches from the normal molding mode to the mold releasing agent treatment mode.

The controller 900 then temporarily stops the lead frame strip magazine part 110 in the in-magazine part 100 and operates the dummy lead frame strip magazine part 130. As a result, and as described above with reference to FIG. 4, the elevator 150' moves the dummy lead frame strip magazine 131 to position A and transfers the dummy lead frame strips 135 to the inloader part 300.

As the controller 900 switches from the molding mode to the mold releasing agent treatment mode, the molding compound tablet feeder 210 in the tablet loader part 200 stops operating and, as described above with reference to FIG. 6, the releasing tablet hoppers 233 descend to place the releasing tablets 231 on the tablet container parts 251 of the tablet container feeder 250. The releasing tablets 231 are placed into and molded in the mold part 400 whereby by-products are generated. The by-products are then transferred through the unloader part 500 to the degating part 600. The pick-up part 700 transfers the by-products degated in the degating part 600 to the by-product unloading part 810. As described above with reference to FIG. 7, the pick-up part 700 and the by-product unloading part 810 are prepared to load the by-products according to the operation mode designated by the controller 900.

As described above, the molding process in the mold releasing agent treatment process is repeated several times to treat the mold with the releasing agent. The by-products generated in this repeated molding process are loaded into the by-product unloading part 810 by the pick-up part 700. Next, the loaded by-products are automatically discharged through the monitoring shutter 817 so that a worker can observe the physical state of the by-products. Thereafter, the controller 900 temporarily stops all components of the molding apparatus and informs the worker when to observe the state of the by-products by sounding an alarm.

If the appearances of the by-products are normal, the controller 900 switches the releasing mode to a mode, that allows a dummy one shot molding process to be performed (e.g., a molding operation mode). The controller 900 then permits the releasing tablet feeder (or cleaning tablet feeder) 230 of the tablet loader part 200 to ascend and the molding compound tablet feeder 210 supplies the molding compound tablets 211 to the mold part 400. Because the dummy lead frame strip magazine part 130 in the in-magazine part 100 is operating, dummy lead frame strips are supplied to the mold part 400. When by-products generated in the dummy one shot molding process are observed to be normal in the by-product unloading part 810, the worker switches the mode for the dummy one shot molding process in the controller 900 to a normal molding mode so that a normal molding process is performed. When the dummy one shot molding process is complete, the controller 900 informs the worker when to observe the physical state of the by-products by sounding an alarm.

The molding apparatus according to an exemplary embodiment of the present invention is designed so that the mold releasing agent treatment process (or the mold wax treatment process) or the mold cleaning process is performed automatically. Thus, the time and a worker's burden required to perform the mold releasing agent treatment process or the mold cleaning process is greatly reduced. As a result, the working ratio of the molding apparatus can increase by 3–5%, thereby increasing the productivity of the molding apparatus.

In an exemplary embodiment of the present invention, the mold cleaning process may be performed in a manner similar to the mold releasing agent treatment process with the exception that an additional step of replacing the releasing tablet hoppers 233 of the tablet loader part 200 with cleaning tablet hoppers needs to be performed.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A molding apparatus for molding semiconductor devices comprising:
    a mold part in which a molding process is performed;
    an in-magazine part which stores normal lead frame strips and dummy lead frame strips to be supplied to the mold part;
    a tablet loading part which stores tablets to be supplied to the mold part, said tablet loading part including a molding compound tablet feeder which stores molding compound tablets to be supplied to the mold part in a first operation mode a releasing tablet feeder which stores releasing tablets to be supplied to the mold part in a second operation mode and a tablet container feeder which is selectively supplied with molding tablets from the molding compound tablet feeder in the first operation mode and releasing tablets from the releasing tablet feeder in the second operation mode;
    a stack magazine part that stacks products molded in the mold part; and
    a pick-up part which transfers the products molded by the mold part to the stack magazine part,
    wherein the molding compound tablet feeder is positioned adjacent to the tablet container feeder and the releasing tablet feeder is positioned over the tablet container feeder.

2. The molding apparatus of claim 1, wherein the first operation mode is for a normal molding process and the second operation mode is for a mold releasing agent treatment process or a mold cleaning process.

3. The molding apparatus of claim 1, wherein the releasing tablet feeder comprises:
    releasing tablet hoppers which store releasing tablets, the releasing tablet hoppers having outlets at the bottom thereof to dispense the releasing tablets;
    stoppers installed at the outlets of the releasing tablet hoppers to control the dispensing of the releasing tablets; and
    a moving part slidably connected to a guide shaft which permits the releasing tablet hoppers affixed thereto to ascend to a first position when the mold apparatus is in the first operation mode and to descend to a second position when the mold apparatus is in the second operation mode so that the releasing tablet hoppers are in a position to dispense releasing tablets to the tablet container feeder.

4. The molding apparatus of claim 3, wherein said releasing tablet hoppers are replaced with cleaning tablet hoppers containing cleaning tablets when said molding apparatus is placed in a mold cleaning mode, said cleaning tablet hoppers having outlets at the bottom thereof to dispense the cleaning tablets.

5. The molding apparatus of claim 3, wherein the releasing tablet hoppers are positioned respectively on a left and right side of the moving part.

6. The molding apparatus of claim 3, wherein the tablet container feeder comprises:
    a container body slidably affixed to guide bars to enable the container body to move in a left and right direction; and
    tablet container parts positioned on the container body for selectively transferring the releasing tablets and the molding compound tablets to the mold part.

7. The molding apparatus of claim 6, wherein the tablet container parts are located at left and right positions on the container body.

8. The molding apparatus of claim 6, wherein the tablet container feeder further comprises a trigger positioned between the tablet container parts which opens the stoppers when the trigger contacts the stoppers.

9. The molding apparatus of claim 8, wherein the trigger is positioned on a trigger body located on the container body.

10. The molding apparatus of claim 8, wherein when the moving part is in the first position, molding compound tablets are supplied to the tablet container parts.

11. The molding apparatus of claim 8, wherein when the moving part is in the second position, releasing tablets are supplied to the tablet container parts.

12. The molding apparatus of claim 6, wherein the molding compound tablet feeder comprises:
    a hopper which stores the molding compound tablets; and
    a cochlea which induces the molding compound tablets from the hopper so that a transfer damper can sequentially transfer the molding compound tablets from the cochlea to the tablet container parts.

13. The molding apparatus of claim 6, further comprising a controller which controls whether the molding apparatus operates in the first operating mode or the second operating mode.

14. A molding apparatus for molding semiconductor devices comprising:
    a mold part in which a molding process is performed;
    an in-magazine part which stores normal lead frame strips and dummy lead frame strips to be supplied to the mold part, the in-magazine part including:
    a normal lead frame strip magazine part which stores normal lead frame strip magazines housing the normal lead frame strips to be supplied to the mold part in a first operation mode;
    a dummy lead frame strip magazine part which stores dummy lead frame strip magazines housing the dummy lead frame strips to be supplied to the mold part in second operation mode; and
    a magazine switching part that controls the transfer of the normal lead frame strips and dummy lead frame strips to the mold part according to the first and second operation modes;
    a tablet loading part which stores tablets to be supplied to the mold part, the tablet loading part including:
    a molding compound tablet feeder which stores molding compound tablets to be supplied to the mold part in a first operation mode;
    a releasing tablet feeder which stores releasing tablets to be supplied to the mold part in a second operation mode;
    a tablet container feeder which is selectively supplied with molding tablets from the molding compound tablet feeder in the first operation mode and releasing tablets from the releasing tablet feeder in the second operation mode;

the releasing table feeder including releasing tablet hoppers which store releasing tablets, the releasing tablet hoppers having outlets at the bottom thereof to dispense the releasing tablets, stoppers installed at the outlets of the releasing tablet hoppers to control the dispensing of the releasing tablets, and a moving part slidably connected to a guide shaft which permits the releasing tablet hoppers affixed thereto to ascend to a first position when the mold apparatus is in the first operation mode and to descend to a second position when the mold apparatus is in the second operation mode so that the releasing tablet hoppers are in a position to dispense releasing tablets to the tablet container feeder;

a stack magazine part that stacks products molded in the mold part;

a by-product unloading part that unloads by-products molded in the mold part; and a pick-up part which transfers the products molded by the mold part to the stack magazine part in the first operation mode and transfers the by-products to the by-product unloading part in the second operation mode.

15. The molding apparatus of claim 14, wherein the first operating mode is a normal molding process and the second operating mode is selected from the group consisting of a mold releasing agent treatment process and a mold cleaning process.

16. The molding apparatus of claim 15, wherein the magazine switching part comprises:

a first container part that contains one of the normal lead frame strip magazines;

a second container part that contains one of the dummy lead frame strip magazines; and an elevator to move the first and second container parts to a position where the normal lead frame strips and the dummy lead frame strips are transferred to the mold part according to the first and second operation modes.

17. The molding apparatus of claim 16, wherein the normal lead frame strip magazine part further comprises a pusher that sequentially transfers the normal lead frame strip magazines to the first container part where the normal lead frame strips are transferred to the mold part.

18. The molding apparatus of claim 16, wherein the dummy lead frame strip magazine part is positioned above the normal lead frame magazine part.

19. The molding apparatus of claim 16, wherein the second container part is positioned over the first container part on a same elevating line so that the first and second container parts ascend and descend together along the elevating line.

20. The molding apparatus of claim 19, wherein when second container part is in a first position to transfer the dummy lead frame strips to the mold part, the first container part is in a second position to transfer empty normal lead frame magazines to an empty magazine part.

21. The molding apparatus of claim 20, wherein the empty magazine part is positioned under the normal lead frame strip magazine part and stores the empty normal lead frame magazines.

22. The molding apparatus of claim 20, wherein in the first operation mode, the first container part is in a first position to transfer the normal lead frame strips from the normal lead frame strip magazine to the mold part and in the second operation mode, the second container part is in a first position to transfer the dummy lead frame strips from the dummy lead frame magazine to the mold part.

23. The molding apparatus of claim 14, wherein said releasing tablet hoppers are replaced with cleaning tablet hoppers containing cleaning tablets when said molding apparatus is placed in a mold cleaning mode, said cleaning tablet hoppers having outlets at the bottom thereof to dispense the cleaning tablets.

24. The molding apparatus of claim 14, wherein the releasing tablet hoppers are positioned respectively on a left and right side of the moving part.

25. The molding apparatus of claim 24, wherein the molding compound tablet feeder is positioned adjacent to the tablet container feeder and the releasing tablet feeder is positioned over the tablet container feeder.

26. The molding apparatus of claim 25, wherein the tablet container feeder further comprises a trigger positioned between the tablet container parts which opens the stoppers when the trigger contacts the stoppers.

27. The molding apparatus of claim 26, wherein the trigger is positioned on a trigger body located on the container body.

28. The molding apparatus of claim 26, wherein when the moving part is in the first position, molding compound tablets are supplied to the tablet container parts.

29. The molding apparatus of claim 26, wherein when the moving part is in the second position, releasing tablets are supplied to the tablet container parts.

30. The molding apparatus of claim 14, wherein the tablet container feeder comprises:

a container body slidably affixed to guide bars to enable the container body to move in a left and right direction; and tablet container parts positioned on the container body for selectively transferring the releasing tablets and the molding compound tablets to the mold part.

31. The molding apparatus of claim 14, wherein the molding compound tablet feeder comprises:

a hopper which stores the molding compound tablets; and a cochlea which induces the molding compound tablets from the hopper so that a transfer damper can sequentially transfer the molding compound tablets from the cochlea to the tablet container parts.

32. The molding apparatus of claim 31, wherein the normal lead frame strip magazine part further comprises a pusher that sequentially transfers the normal lead frame strip magazines to the first container part where the normal lead frame strips are transferred to the mold part.

33. The molding apparatus of claim 14, wherein the by-product unloading part is positioned adjacent to the stack magazine part.

34. The molding apparatus of claim 31, wherein the by-product unloading part comprises:

a housing;

a container part that holds the by-products;

a monitoring shutter installed on the housing through which the by-products loaded on the container part are discharged to an external container part.

35. The molding apparatus of claim 34, wherein the pick-up part transfers the by-products to the container part.

* * * * *